United States Patent [19]

Hashimoto et al.

[11] Patent Number: 5,288,988

[45] Date of Patent: Feb. 22, 1994

[54] PHOTOCONVERSION DEVICE HAVING RESET CONTROL CIRCUITRY

[75] Inventors: Seiji Hashimoto, Yokohama; Mahito Shinohara, Naritanishi, both of Japan

[73] Assignee: Canon Kabushiki Kaisha, Tokyo, Japan

[21] Appl. No.: 921,969

[22] Filed: Aug. 4, 1992

Related U.S. Application Data

[63] Continuation of Ser. No. 738,927, Aug. 2, 1991, abandoned.

[30] Foreign Application Priority Data

| Aug. 7, 1990 | [JP] | Japan | 2-207571 |
| Oct. 15, 1990 | [JP] | Japan | 2-273212 |
| Oct. 15, 1990 | [JP] | Japan | 2-273213 |
| Oct. 15, 1990 | [JP] | Japan | 2-273214 |

[51] Int. Cl.$^5$ .............................................. H01J 40/14
[52] U.S. Cl. .................................. 250/208.1; 348/302
[58] Field of Search ................ 250/208.1; 358/213.11, 358/213.12, 213.13, 213.25, 213.28; 357/40

[56] References Cited

U.S. PATENT DOCUMENTS

| 4,504,865 | 3/1985 | Nishizawa et al. | 358/213.12 |
| 4,524,391 | 6/1985 | Nishizawa et al. | 358/213.12 |
| 4,612,629 | 9/1986 | Harari | 358/213.12 |
| 4,686,554 | 8/1987 | Ohmi et al. | 357/40 |
| 4,731,665 | 3/1988 | Hashimoto et al. | 358/213.27 |
| 4,779,137 | 10/1988 | Toji et al. | 358/213.11 |
| 4,816,910 | 3/1989 | Hashimoto et al. | 358/213.27 |
| 4,831,454 | 5/1989 | Tanaka et al. | 358/213.31 |
| 4,879,470 | 11/1989 | Sugawa et al. | 250/208.1 |
| 4,910,597 | 3/1990 | Harada et al. | 358/213.15 |
| 4,914,519 | 4/1990 | Hashimoto et al. | 358/213.18 |
| 4,959,723 | 9/1990 | Hashimoto | 358/213.11 |
| 4,962,412 | 10/1990 | Shinohara et al. | 357/30 |
| 4,967,067 | 10/1990 | Hashimoto et al. | 250/208.1 |
| 5,008,206 | 4/1991 | Shinohara et al. | 437/3 |
| 5,019,702 | 5/1991 | Ohzu et al. | 250/208.1 |

FOREIGN PATENT DOCUMENTS

| 132076 | 1/1985 | European Pat. Off. |
| 277016 | 8/1985 | European Pat. Off. |
| 253678 | 1/1988 | European Pat. Off. |

Primary Examiner—David C. Nelms
Assistant Examiner—Stephone B. Allen
Attorney, Agent, or Firm—Fitzpatrick, Cella, Harper & Scinto

[57] ABSTRACT

A photoconversion device comprises plurality of cells 1 each having a bipolar type sensor element T, the base of which is connected to a reset switch FET M and is also capacitively coupled to a control electrode. The device is read out by providing a positive pulse to the base of the sensor T through the control electrode, and is refreshed by a first operation in which the base is set to a preset level through the FET M and a second operation in which the base-emitter junction of the sensor T is forward biased. A control terminal 19 provides a high level reset voltage to a main electrode region of the FET M through an emitter follower arrangement 18 to turn the FET M on for the first reset operation without providing a negative pulse on the horizontal drive line 2 which is connected both to the gate of the FET M and the capacitively coupled control electrode. This permits a relatively high voltage read out signal to be provided on the horizontal drive line 2 without subjecting the line to an excessive total voltage swing.

38 Claims, 13 Drawing Sheets

FIG. 2
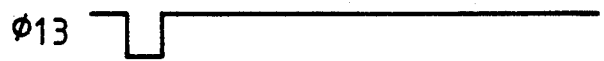
FIG. 6
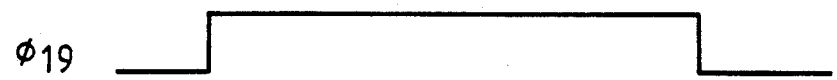

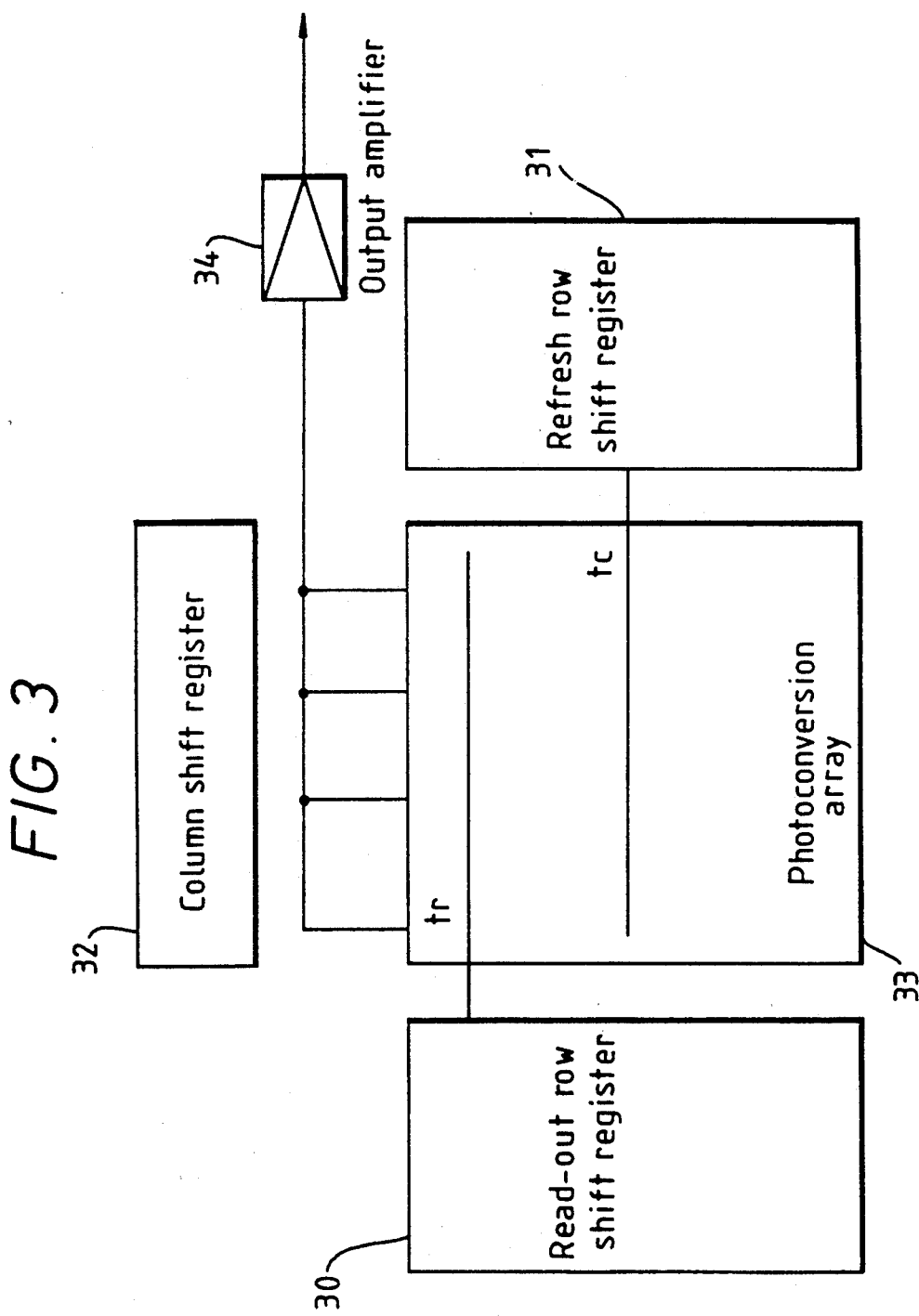

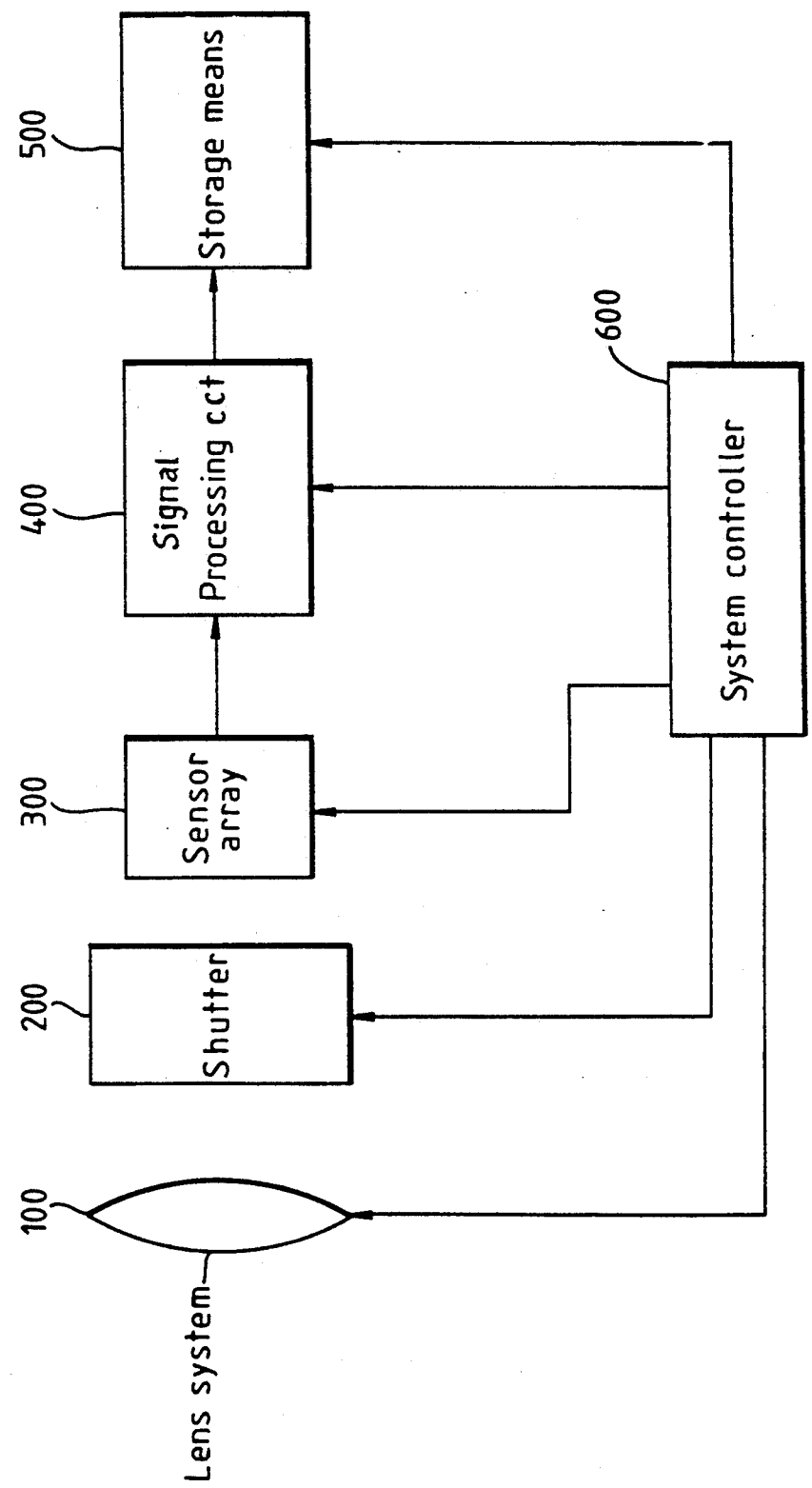

PHOTOCONVERSION DEVICE HAVING RESET CONTROL CIRCUITRY

This application is a continuation of prior application, Ser. No. 07/738,927 filed Aug. 2, 1991, now abandoned.

FIELD OF THE INVENTION

The present invention relates in one aspect to a photoconversion device. In another aspect it relates to control circuitry for a photoconversion element, and also to a photoconversion device comprising the control circuitry and the element.

BACKGROUND OF THE INVENTION

The present invention is usable with a photoconversion element of the type in which charge carriers generated in response to incident light are stored in a control region of a transistor, and a signal related to the quantity of stored carriers is read out through a main electrode region. An element of this type, which is capable of providing an output signal in which the stored charge is amplified, is known from EP-A-0132076. The photoconversion element of that document is a bipolar transistor, and the carriers are stored in the base. The signal may be read out through the collector or the emitter. The base potential may be controlled via a capacitively coupled electrode, but the present invention is not limited to this. Also, the present invention is not limited to bipolar devices. EP-A-0132076 discloses an operation cycle for its photoconversion element in which incident light causes electrical carriers to be accumulated in the control region of the element during an accumulation period, a signal dependent on the amount of accumulated charge is read out through a main electrode region during a read period, and then the state of the control region is reset to a standard condition during a reset or refresh period.

EP-A-0222624 and EP-A-0253678 disclose a preferred arrangement in which two reset or refresh operations are carried out in succession. The first is a so-called complete refresh, in which charge carriers are injected into the control region at least in the condition that it has been exposed to very little light during the accumulation period so that the quantity of stored charge is very low, or alternatively the control region potential is set to a defined level, in either case in order to ensure that the control region has a greater quantity of stored charges in it than it has at the end of an accumulation period in which no light has been incident on the photoconversion element. This is followed by a so-called transient refresh operation in which the photoconversion element is biased so that charges stored in the control region flow out through a main electrode region.

This two-step refresh process has been found to be advantageous compared with using a transient refresh process alone. If the transient refresh condition is maintained for long enough, substantially all of the stored charges in the control region can be removed. However, if the transient refresh condition is maintained only for a relatively short time, enabling a faster operation of the photoconversion device, the level of stored charge in the control region is brought down to some particular non-zero standard level, provided that the level of stored charge was sufficiently above the standard level before the transient refresh operation began. However, where the stored charges are already at the standard level before the transient refresh operation begins, e.g. because the photoconversion element has not received any light during the accumulation period, the level of stored charges decreases slightly during the transient refresh operation so as to finish at a level below the standard level. Thus the level of stored charge in a photoconversion element which is not receiving light will slowly decrease during successive exposure periods, and when it next receives light its output signal will not be correct. By conducting a complete refresh operation before the transient refresh operation, it can be ensured that the control region contains sufficient stored charge at the beginning of the transient refresh operation to bring the level of stored charge to the standard level at the end of the transient refresh operation.

In the arrangements disclosed in the prior art documents discussed above, where a photoconversion device comprises a two-dimensional array of photoconversion elements, the control circuitry typically refreshes the elements of a row simultaneously, and refreshes different rows at different times.

An arrangement is known from EP-A-0274236 in which the photoconversion element is a bipolar transistor and the emitter is held at ground level during a transient refresh operation. During a subsequent accumulation period the emitter is held at a standard voltage which is lower than the collector voltage, so as to limit the voltage to which the base can rise as it accumulates carriers, as a measure against "blooming" following an overflow of carriers from an element receiving very strong light.

EP-A-0132076, EP-A-0222624, EP-A-0253678 and EP-A-0274236 are incorporated herein by reference.

An example of a photoconversion device having a two-dimensional array of photoconversion elements is illustrated in FIG. 1. In this Figure, the photoconversion elements are bipolar transistors in which the base is controlled by a capacitively coupled electrode. However, as mentioned above, the present invention is not limited to this type of photoconversion element, and alternative photoconversion elements, including elements without a capacitively coupled control electrode for the control region and elements which are not bipolar transistors, are disclosed in EP-A-0253678.

In FIG. 1, a unit picture cell of the array comprises a photoconversion element or sensor (which is a bipolar transistor type device as disclosed in EP-A-0132076) T. The base of the sensor T is capacitively coupled to a control electrode, and this coupling is represented by a capacitor C. Additionally, the base is coupled to a P-channel FET (e.g. a MOSFET) M. Each row of the array of sensors has a common horizontal drive line 2, connected to the capacitor electrode and the gate of the FET M of each cell. Each column of the array has a common vertical output line 3, connected to the emitter of each sensor T. Each vertical output line 3 is connected to ground through a respective FET 4, for resetting the vertical output line 3. Each vertical output line 3 is also connected to a respective capacitor 5 for storing signals output from a sensor T onto the output line 3, through a respective FET 6. Each storage capacitor 5 is connected to a common horizontal output line 7 through a respective FET 8, and the common horizontal output line 7 provides an input to an amplifier 9. The common horizontal output line 7 is also connected to ground through an FET 10.

For controlling the operation of the device, each horizontal drive line 2 is connected through a respective FET 11 to a terminal 12 for supplying drive pulses, and the rows of the array are selected by outputs from a row shift register which turn on the FETs 11 in turn. Control pulses to a terminal 13 turn on the FETs 4 to ground the vertical output lines 3, and control pulses to a terminal 14 to turn on the FETs 6 to connect the vertical output lines 3 to the storage capacitors 5. Outputs from a column shift register selectively turn on the FETs 8 to connect the selected storage capacitors in turn to the common horizontal output line 7. Control pulses to a terminal 15 turn on the FET 10 to ground the horizontal common output line 7 to reset it. The photoconversion output signal from the device is provided from the amplifier 9 to an output terminal 16.

As can be seen in FIG. 1, an additional FET M is provided at one end of each row, so that an FET M is present at each end of each row. Except at each end of each row of the array of sensors T, the two main leectrode regions (source and drain) of the FET M of each cell are connected respectively to the base of the sensor T of the same cell and the base of the sensor T of an adjacent cell. At each end of each row, the FET connects the base of a sensor T to a line leading to ground. Thus, when a horizontal drive line 2 turns on the FETs of one row of sensors, the bases of all the sensors in the row are connected through the FETs M to ground. The additional FET M in each row can be omitted, in which case the line of FETs is connected to ground at one end only.

FIG. 2 illustrates waveforms of the signals applied to the terminals 12,13 and 14. Throughout this specification the convention will be used that the waveform applied to a terminal will be indicated by $\phi$ followed by the number of the terminal.

During the accumulation period, when the photoconversion device is exposed and charges are accumulated in the base of each sensor T in accordance with the amount of light incident on the sensor, the relevant row of the array of sensors is not selected by the row shift register. If none of the rows is being read or refreshed $\phi 12$ is at ground, $\phi 13$ is high to connect the vertical output lines to ground, and $\phi 14$ is low to isolate the vertical output lines from the storage capacitors 5. When a row is selected for reading and refreshing, the row shift register turns on the corresponding FET 11. For the reading operation $\phi 13$ goes low to isolate the emitters of the sensors T and the vertical output lines 3 from ground, and $\phi 14$ goes high to connect the emitters and the vertical output lines 3 to the storage capacitors 5. $\phi 12$ goes high sufficiently to raise the potential of the bases of the sensors T in the selected row through the action of the capacitor C to turn on the transistor type sensors T so that an output signal corresponding to the quantity of charges stored in the base region is provided through the emitter region to the respective vertical output line 3 and is stored on the respective storage capacitor 5. The positive pulse of $\phi 12$ firmly turns off the FETs M, so that the base voltage level is not influenced by the ground connection through the FETs M during read-out. Subsequently, the column shift register turns on the FETs 8 in turn to read out the signals from the storage capacitors 5 to the common horizontal output line 7 and the amplifier 9.

For a refreshing operation, $\phi 13$ goes high and $\phi 14$ goes low to isolate the emitters and the vertical output lines 3 from the storage capacitors 5 and connect them again to ground, and $\phi 12$ goes sufficiently low to turn on the P-type FET M. The low-going pulse of $\phi 12$ will initially bias the base of each sensor to turn if off, and then the base of each sensor will become grounded through the FETs M, with charges flowing into or flowing out of the base region depending on the quantity of charge carriers which have been accumulated during the accumulation period. This provides the so-called complete refresh operation, in which the base of each sensor T of the selected row is set to a common potential.

Next, $\phi 12$ goes high once again to turn off the P-type FETs M and forward bias the base of the sensor T relative to the emitter by the action of the capacitor C. The emitter remains connected to ground through the FET 4. This provides the so-called transient reset, during which charges stored in the base region are removed through the emitter region. Because the base of each sensor T of the selected row has been set to a standard level through the FETs M during the complete reset operation, all of the base regions of the sensors in the row are set to a common refresh level at the end of the transient refresh operation. $\phi 12$ then returns to the ground level to begin the next accumulation period, and the row shift register can turn off the relevant FET 11 to de-select the row.

As will be appreciated by those skilled in the art, it is possible to provide an alternative construction in which a first set of horizontal drive lines controlled by a first row shift register are used exclusively for read out, and a second set of horizontal drive lines, controlled by a second row shift register, are used exclusively for refreshing, and such an arrangement is illustrated schematically in FIG. 3.

In FIG. 3, read out is controlled by a read out row shift register 30 with a timing tR and refresh is controlled by a refresh row shift register 31 with a iming tC. By controlling the period between the drive timing tR of the read out row shift register and the drive timing tC of the refresh row shift register, the accumulation period for each sensor can be controlled, providing the so-called electronic shutter function. In this Figure, a column shift register 32, the photoconversion array 33 and the output amplifier 34 are also illustrated schematically.

The arrangement of FIGS. 1 and 2 has the advantage that, by providing a common control line for the capacitor electrode controlling the base through capacitor C and the gate of the FET M, the FET M is automatically driven reliably into the off state during read out and the transient refresh operation. However, the total safe voltage range between the highest voltage and the lowest voltage which may be applied to the horizontal drive lines 2, is defined by the characteristics of the components of the photoconversion device, and particularly by their maximum withstand voltages. Consequently, the fact that the horizontal drive lines 2 must go negative in order for the complete refresh operation to be carried out limits the maximum positive voltage which can be applied during transient refresh and read out. This limits the extent to which the transistor type sensor element T can be turned on, so that the read out signal remains relatively low and the maximum output signal when the sensor is saturated by bright light is relatively small. Additionally, the circuit for supplying the drive waveform $\phi 12$ must be relatively complicated as three different levels are required for this waveform.

In the devices of FIGS. 1 to 3 a problem can arise when a still picture is being taken, for example if the device is used in a still video camera, particularly when a still picture is required of a moving object. Because each row is read and refreshed at a different time, the accumulation periods for different rows are provided with slightly different timings. This results in an image distortion. This image distortion can be eliminated by providing a mechanical shutter which is opened after all of the rows have been refreshed and is closed before any of the rows are read. However, in this case there may still be an undesirable dark current during the time taken to read and refresh all of the picture cells.

The present invention in its various aspects seeks to solve or reduce the various problems discussed above or provide improvements over the arrangements described.

SUMMARY OF THE INVENTION

In the present specification reference is made to main electrode regions and control regions of devices. As will be well understood by those skilled in the art, most electrical components have first and second main terminals, such as the two ends of a resistor, and the two terminals of a diode or a capacitor, and in the case of three terminal devices such as transistors, SCRs and TRIACs, a voltage or current between the two main terminals is influenced by a signal at a control terminal. Thus, a bipolar transistor has a main current path between its collector and its emitter, which are main electrode regions, and the base is a control region, and an FET has a main current path between the source and drain, which are main electrode regions. A double-emitter transistor will have two main current paths, one for each emitter.

According to a first aspect of the present invention there is provided a photoconversion device in which a reset switch means is turned on to refresh a photoconversion element by varying the voltage at a main electrode of the switch means, preferably while keeping the voltage at a control electrode constant. The present invention also provides a control circuit for a photoconversion cell comprising a connection for a main terminal of a refresh switch means of the cell and means for applying a voltage to the connection for turning on the switch means. The invention also provides a method of refreshing a photoconversion element by turning on an associated refresh switch means by applying a turn on voltage to a main terminal of a refresh switch means.

In an embodiment, the reset switch means such as FET M is turned on by applying an appropriate voltage to a main terminal rather than by varying the voltage applied to a control terminal, thereby avoiding the need for the refresh control pulse to be applied via a horizontal drive line. In this way, the drive line can provide a greater read pulse voltage without exceeding the safe or stable operating range of the apparatus.

In another aspect of the present invention storage regions of photoconversion elements of a photoconversion device having an array of elements are connected to a standard voltage for resetting or injecting carriers under at least some conditions of the storage region at the same time for elements of a plurality of rows of the array, and preferably at the same time for all the elements in the array. The present invention encompasses a device operating in this manner or having means to operate in this manner, a control circuit for a plurality of elements having means to control them in this manner, and a method of operating the device in this manner.

In another aspect of the present invention a photoconversion element in which charges are stored in a control region is refreshed or reset by applying a refresh or reset voltage to a main electrode region of the element so as to forward bias the element and refresh or reset the control region through the main electrode region. The present invention provides a photoconversion device operating in this manner or having means to operate in this manner, a control circuit for a photoconversion element having means to refresh or reset it in this manner, and a method of refreshing or resetting a photoconversion element in this manner.

In another aspect of the present invention reset or refresh of a control region of a photoconversion element through a main region of the element is carried out simultaneously for elements in a plurality of rows in a two-dimensional array of such elements, and preferably at the same time for all the elements in the array. The invention provides a device, a control circuit and a method using this concept.

In another aspect of the present invention the reset or refresh operation of photoconversion elements in a plurality of rows of a two-dimensional array of elements, and preferably all of the elements in the array, is terminated simultaneously. The invention encompasses a device, a control circuit and a method using this concept. This concept permits an electronic definition of the beginning of the exposure period without requiring different parts of the array to have different exposure period timings.

In another aspect of the present invention a read out terminal of a photoconversion element is held at a first level during a period in which charge is accumulated on a control region in response to incident light and is brought to different level before a read out period, the levels being chosen so that there is a voltage for the control region such that charge will flow to the read out terminal when it is at the level provided during the accumulation period but charge will not flow to the read out terminal when it is at the voltage level selected for the read out period. The invention includes a device, a control circuit and a method using this concept. This concept enables the maximum amount of charge which can be stored in the control region if bright light is incident on the photoconversion element to be limited to a level which provides a margin of safety against the element influencing a signal read onto a common read out line from another element, thereby resisting a "blooming" effect of bright light exposure on one photoconversion element.

BRIEF DESCRIPTION OF THE DRAWINGS

Embodiments of the present invention, given by way of non-limiting example, will now be described with reference to the accompanying drawings, in which:

FIG. 2 shows a control waveform regime for the operation of the device of FIG. 1;

FIG. 3 illustrates schematically a device having separate read out and refresh row shift registers;

FIG. 4 shows schematically a camera arrangement in which embodiments of the present invention may be used;

FIG. 6 shows a control waveform regime for the device of FIG. 5;

DESCRIPTION OF THE PREFERRED EMBODIMENTS

Figure 1:
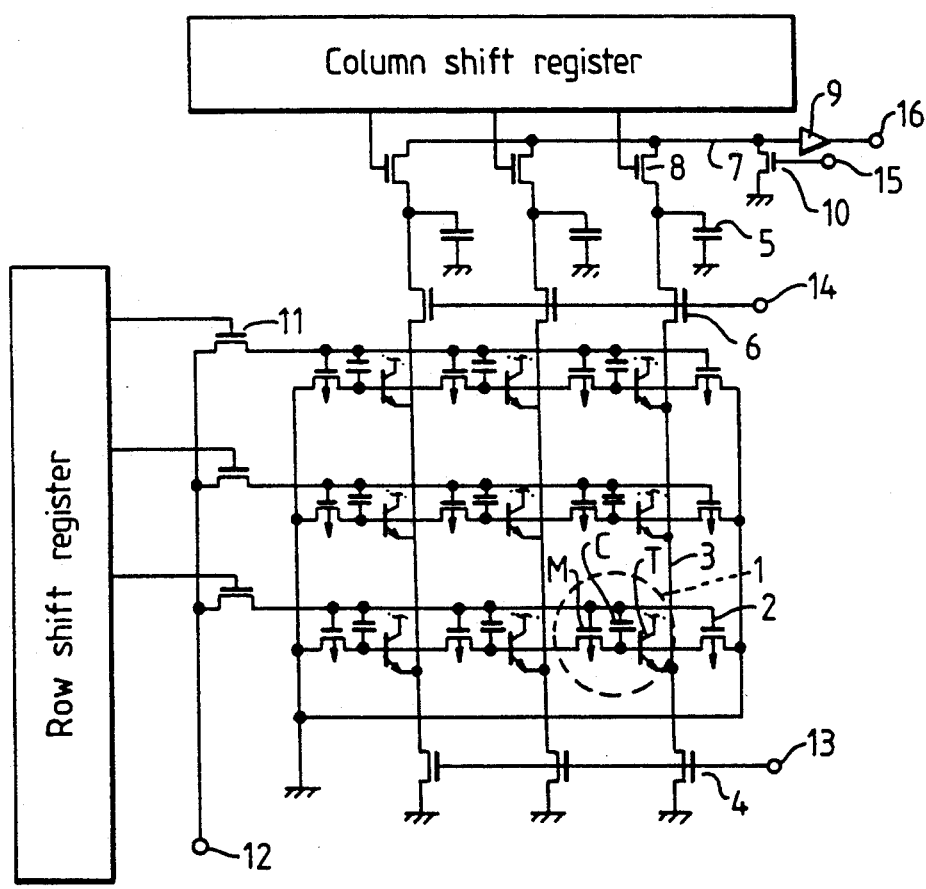
FIG. 1 shows a photoconversion device illustrated for the purpose of explanation.

Embodiments of the present invention may be used in a camera system such as is illustrated schematically in FIG. 4. Light from a scene passes through a lens system 100 and a mechanical shutter 200 to be imaged on a photoconversion element array of a photoconversion device 300. The opening and closing of the mechanical shutter 200 can control the exposure time of the image on the photoconversion device 300, although the effective exposure period can also be influenced by the optical shutter effect of the sensor reset timing of the photoconversion array as has already been mentioned. A sequential output signal from the photoconversion device 300 is processed in a signal processing circuit 400, and is stored in a storage medium 500 such as a semiconductor memory or a floppy disc. The operations of the components are controlled by a system controller 600. Photoconversion devices embodying the present invention can be used as the photoconversion device 300.

Figure 5:
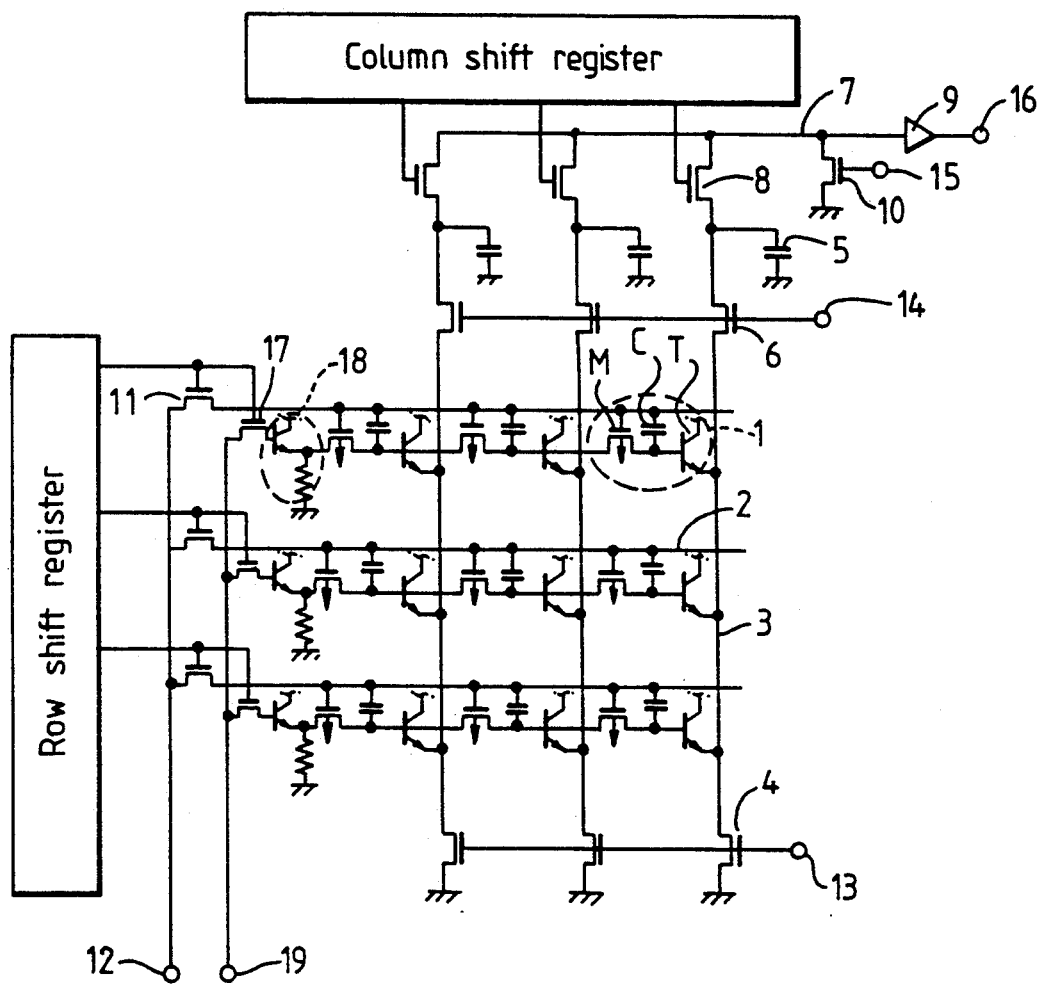
FIG. 5 shows a photoconversion device according to a first embodiment of the present invention.

FIG. 5 illustrates a first embodiment of the present invention. Many parts of the photoconversion device shown in FIG. 5 are the same as in FIG. 1, and such parts have been given the same reference numeral. However, as compared with FIG. 1 the device of FIG. 5 comprises a second FET 17 for each row, also controllable by the row shift register. The main electrode regions (source and drain) of the FETs M of the cells, which are used in the complete reset operation, are connected to the bases of adjacent sensors T of the row, as in FIG. 1, except at the ends of the rows. At the ends of the rows, the FETs M are not connected to ground, but are instead connected to the output of respective emitter followers 18 which are provided for each row. The bases of the emitter followers 18 are connected through the respective FETs 17 to a terminal 19. Thus, when the row shift register selects a given row, the source of the reset switch FET M of the end cell is connected to a voltage set by the waveform at the terminal 19. The emitter follower 18 ensures that a high current can be sustained. In this embodiment, the additional FET M at the end of each row is omitted.

The waveforms at the control terminals 12,13,14,19 in the read and refresh operations of the device of FIG. 5 are shown in FIG. 6. The reading operation is similar to the operation described with reference to FIG. 2 for the device of FIG. 1. Thus, $\phi 13$ goes low to separate the vertical output lines 3 from ground, and $\phi 14$ goes high to connect the vertical output lines 3 to the storage capacitors 5. $\phi 12$ goes high, transmitting a high voltage pulse to the horizontal drive line 2 of the selected row through the FET 11 which has been turned on by the row shift register. The row shift register will also have turned on the FET 17 for the selected row, but $\phi 19$ remains low so that the source of the FET switch M of the end cell is at ground as in the arrangement of FIG. 1. The high voltage pulse on the horizontal drive line 2 is transmitted through the capacitors C of each cell of the selected row to the bases of the bipolar transistor type sensor elements T, which turn on. Accordingly, read out signals are placed on the vertical output lines 3 and are stored in the storage capacitors 5.

For the complete refresh operation, by which the bases of the sensors T are set to a predefined voltage level, $\phi 12$ returns to ground, but does not go - negative as in the device of FIG. 1. Instead, $\phi 19$ goes positive, raising the source voltage of the end reset FET M, through the emitter follower 18. Thus, the FET M turns on by having its source voltage raised instead of by having its gate voltage lowered. When it has turned on, it applies the voltage from terminal 19 to the base of its associated sensor T, and also to the source of the next reset FET M. Consequently, the next reset FET M turns on in the same way, and in this manner all of the reset FETs M are turned on and the bases of all of the sensors T in the selected row are reset by the voltage at control terminal 19 through the emitter follower 18. This is the complete refresh operation.

At the end of the complete refresh operation $\phi 19$ goes low again and the transient reset operation is carried out. This is similar to the transient reset operation of FIGS. 1 and 2. $\phi 13$ is high to connect the emitters to ground through the vertical output lines 3, and $\phi 12$ goes high to forward bias the bases of the sensors T relative to the emitters, so that the quantity of stored charge falls to the predefined level.

Subsequently, $\phi 12$ falls again, reverse biasing the base-emitter junction, and the next accumulation period begins.

Because the complete refresh operation is carried out by driving the sources of the reset switch FETs M high from terminal 19 rather than by driving their gates low from terminal 12, the voltage on the horizontal drive lines 2 does not need to go negative, and accordingly a higher positive read out control voltage can be provided without the total voltage range on the horizontal drive line 2 being excessive. Thus, a higher level read out signal can be obtained. Additionally, the waveforms at each of the terminals 12,19 vary only between two voltages, and so the control circuitry may be less complex than the circuitry required to provide the three level waveform at terminal 12 in the arrangement of FIGS. 1 and 2.

Figure 7:
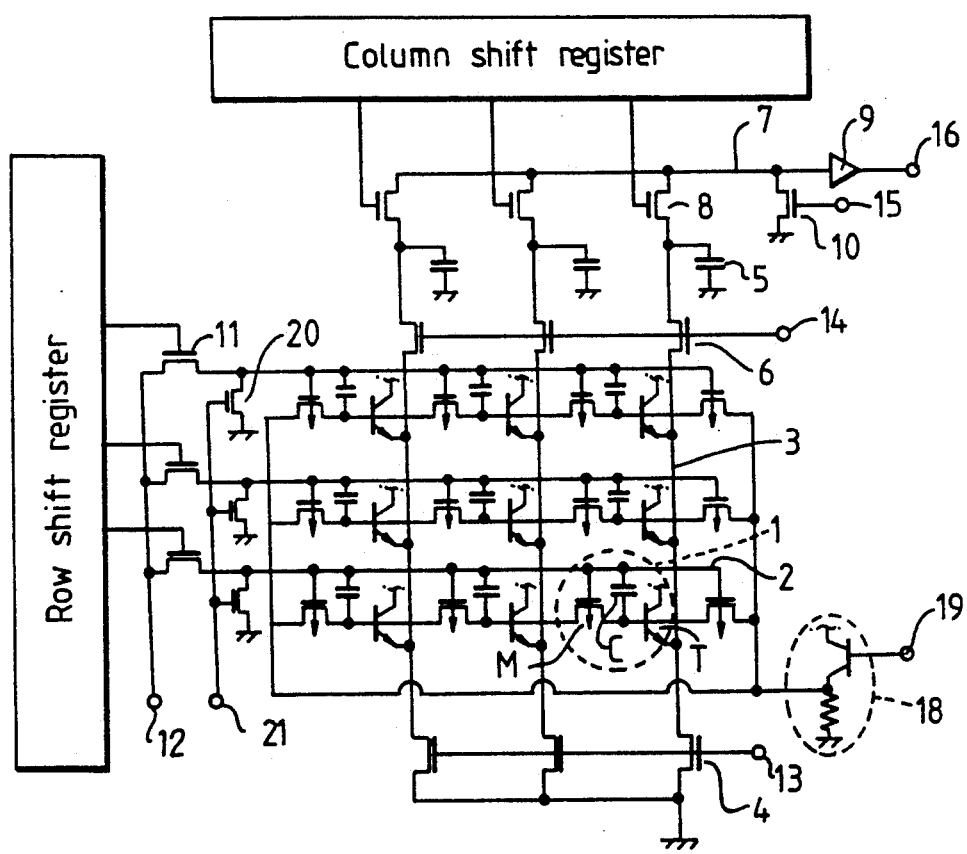
FIG. 7 shows a photoconversion device according to a second embodiment of the present invention.

FIG. 7 illustrates a second embodiment of the present invention. In this embodiment, the end FET transistors M of each row are connected together, and are connected to the output of a single common emitter follower structure 18. Additionally, each horizontal drive line 2 is connected to ground through a respective FET 20, which is controlled by a common control terminal 21.

In this embodiment the complete refresh operation for all the cells of the two-dimensional array is carried out simultaneously. A high voltage is applied to terminal 21, to connect all of the horizontal drive lines 2 to ground independently of the operation of the row shift register. In this condition, the high voltage is applied to control terminal 19 to raise the source terminals of the refresh FETs M of the end cells of each row through the emitter follower structure 18. In this way, the complete refresh operation is carried out as described with reference to FIGS. 5 and 6, except that all of the cells are refreshed in a single complete refresh operation. Subsequently, the transient refresh operation may be carried out for each row in succession, in accordance with the selection by the row shift register, in the manner already described.

This embodiment has the advantages of the embodiment of FIG. 5, and additionally less time is required for the complete refresh operation since only a single operation is required to provide complete refresh for all rows. This embodiment is usable in a still video camera, for example.

Figure 8:
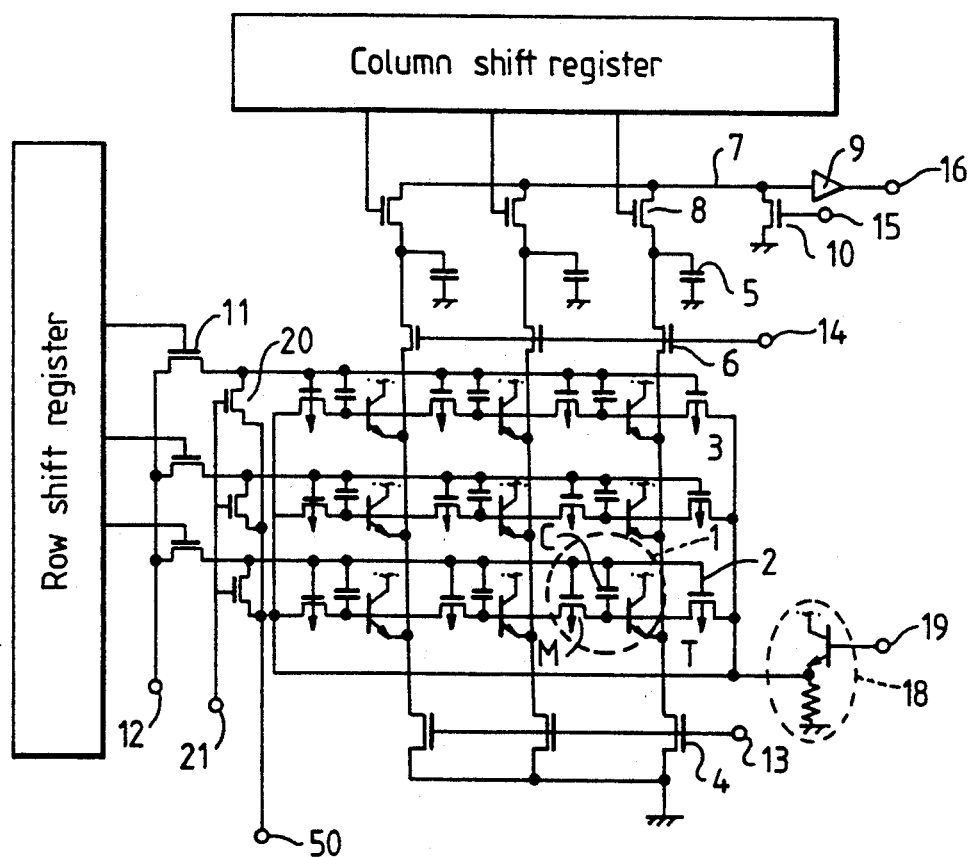
FIG. 8 shows a photoconversion device according to a third embodiment of the present invention.

FIG. 8 shows a third embodiment of the present invention. This embodiment is similar to the embodiment of FIG. 7, except that the FETs 20 do not connect the horizontal drive lines 2 to ground, but instead connect them to a further control terminal 50. With this arrangement, it is possible to connect all of the horizontal drive lines 2 to the terminal 50 simultaneously, and provide a high pulse on the terminal 50 so that a transient refresh operation can be carried out simultaneously for all of the cells of the array.

As will be appreciated by those skilled in the art, the provision of the terminal 50 also means that the complete refresh operation can be carried out simultaneously for all the cells of the array even if the end FETs M of each row are connected to ground as in FIG. 1 and the emitter follower arrangement 18 and the terminal 19 are not provided. A simultaneous complete refresh operation could in this case be provided by connecting all of the horizontal drive lines 2 to the terminal 50 through the FETs 20, and applying a negative voltage to the terminal 50. However, this is less advantageous than the structure of FIG. 8, since it means that the horizontal drive line 2 must carry a negative voltage at times, thereby reducing the maximum positive voltage which can safely be applied to the line.

Figure 9:
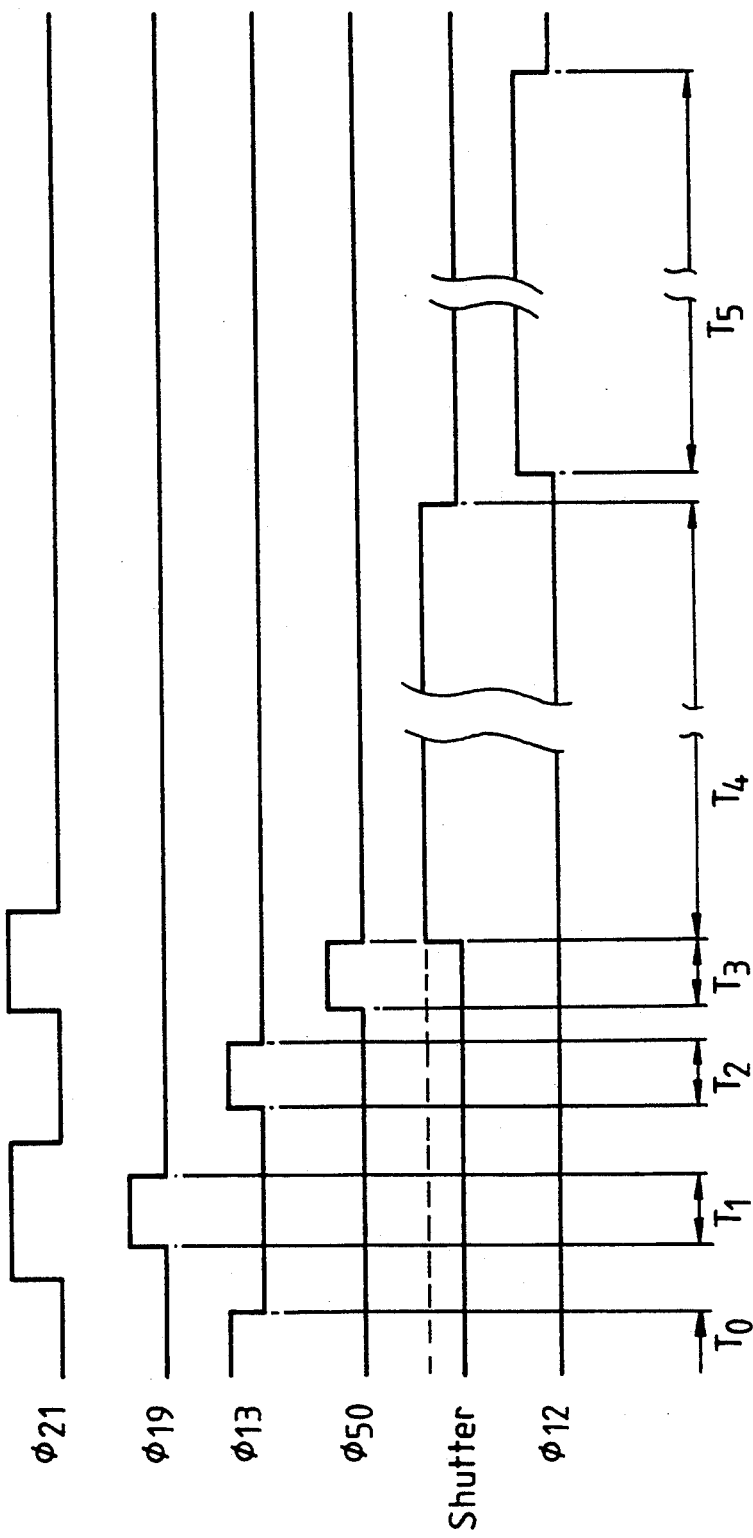
FIG. 9 shows a control waveform regime for the device of FIG. 8.

FIG. 9 is a timing diagram for the control waveforms for the embodiment of FIG. 8. FIG. 9 shows a control regime in which two separate transient refresh operations are carried out after the complete refresh operation.

According to FIG. 9, at an initial period T0 the shutter may be either open or closed. $\phi 13$ is high, so that the emitters of the photoconversion element sensors T are connected to ground. It is particularly desirable to connected the emitters to ground if the shutter is open, in case strong light is incident on the photoconversion device so that a large quantity of charges are stored in the base of the sensors T. In this case, the grounding of the emitters enables excessive charges in the base to drive the base-emitter junction into forward bias, and the excessive charges are then led off to ground through the emitter. If the emitter is not grounded, the base voltage can continue to rise in bright light, taking the emitter voltage up with it. In this case, there is a possibility that during the complete reset operation the base will be set to a voltage below the emitter voltage, and it may then become difficult to forward bias the base-emitter junction during a subsequent transient reset operation, so that the transient reset operation does not correctly reset the base voltage.

The complete refresh operation is carried out in period T1. $\phi 21$ goes high, turning on the FETs 20 and connecting the horizontal drive lines 2 to the terminal 50. The terminal 50 stays at ground. $\phi 19$ goes high, and this voltage is applied through the emitter follower 18 to the refresh FETs M, turning them on, so that the bases of the sensors T are refreshed in the manner described above.

Following the simultaneous complete refresh in period T1, $\phi 19$ and $\phi 21$ go low and during period T2 $\phi 13$ goes high to reconnect the emitters of the sensors T to ground. This provides a first simultaneous transient refresh operation.

In period T3, a second simultaneous transient refresh operation is carried out. $\phi 21$ goes high again to connect the horizontal drive lines 2 to the terminal 50, and $\phi 50$ goes high to drive the bases of the sensors T high through the capacitors C. Preferably, $\phi 21$ is higher than $\phi 50$ during this period, to avoid the high voltage on the terminal 50 adversely affecting the turn-on characteristics of the FETs 20.

At the end of the second simultaneous transient refresh period T3, the charge accumulation period (exposure period) T4 begins, and the shutter is opened if it was not already open. If the shutter was already open, the end of the second simultaneous transient refresh period T3 begins the exposure period through the so-called electronic shutter effect. As is shown in FIG. 9, the exposure period T4 is ended by the closure of the mechanical shutter 200, and subsequently the photoconversion signals are read out during a read out period T5 in which the voltage at terminal 12 is high and the read out operation is controlled by the row shift register and the column shift register as will be apparent to those skilled in the art.

In this embodiment, the exposure period may be started by the electronic shutter effect of the end of the second simultaneous transient refresh period T3, such that the timing of the exposure period is the same for all rows because this refresh operation is simultaneous for all rows.

Figure 10:
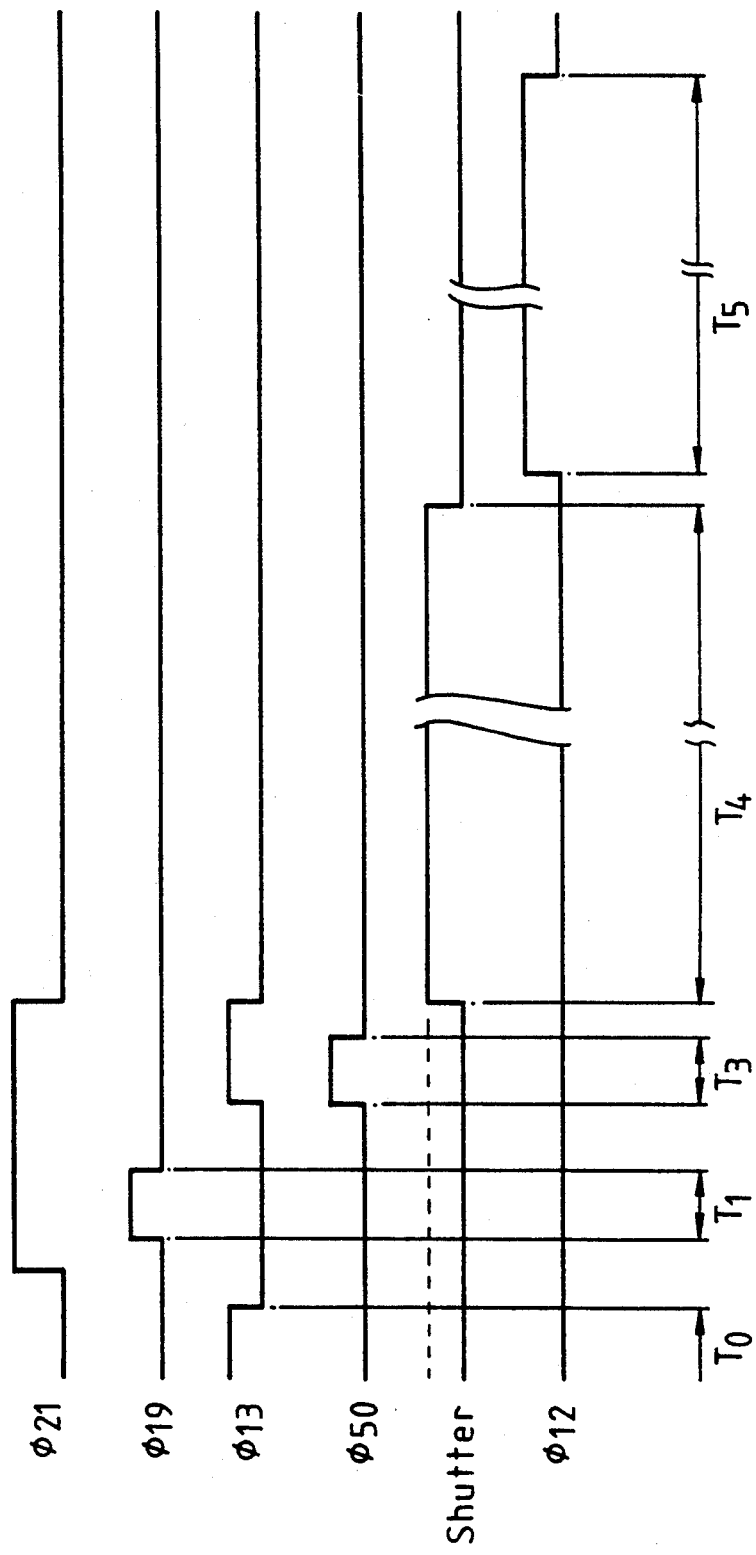
FIG. 10 shows an alternative control waveform regime for the device of FIG. 8.

FIG. 10 shows an alternative control signal regime for the photoconversion device of FIG. 8. In this control regime only a single transient refresh operation is carried out, in period T3, and period T2 is eliminated. The operation of the device in accordance with FIG. 10 is substantially the same as its operation in accordance with FIG. 9, except that in FIG. 10 at the end of the simultaneous complete refresh period T1 the waveform $\phi 21$ remains high, and then in period T3 $\phi 13$ and $\phi 50$ both rise to a high level to carry out a single simultaneous transient refresh operation.

In the control regimes of FIGS. 9 and 10, all of the refresh operations are simultaneous for all rows of the device. Consequently, the time required for the refresh operations is relatively small, which assists in providing high speed operation of the device.

As mentioned above, if very bright light is incident on a photoconversion element before the refresh operations are carried out, the emitter voltage of the element may rise to a high level compared with the level of the base following the complete refresh operation, such that the base-emitter junction is not forward biased, or is not sufficiently forward biased, during a subsequent transient refresh operation. Additionally, the arrangement of the control terminal 19 and the emitter follower 18 means that in the complete refresh operation the base terminals of the sensors T will be set to a voltage higher than ground. The positive pulse applied to the base voltage through the capacitor C for transient refresh drives the base voltage even higher, and there is a possibility that this might lead to undesirably large currents flowing, at least for a brief period, during the transient reset operation. The operation carried out during period T2 assists in reducing these potential difficulties, by setting the emitter voltage to ground before the positive pulse is applied to the base for a transient refresh operation. However, a further embodiment of the present invention, illustrated in FIG. 11, is preferred for reducing these difficulties.

Figure 11:
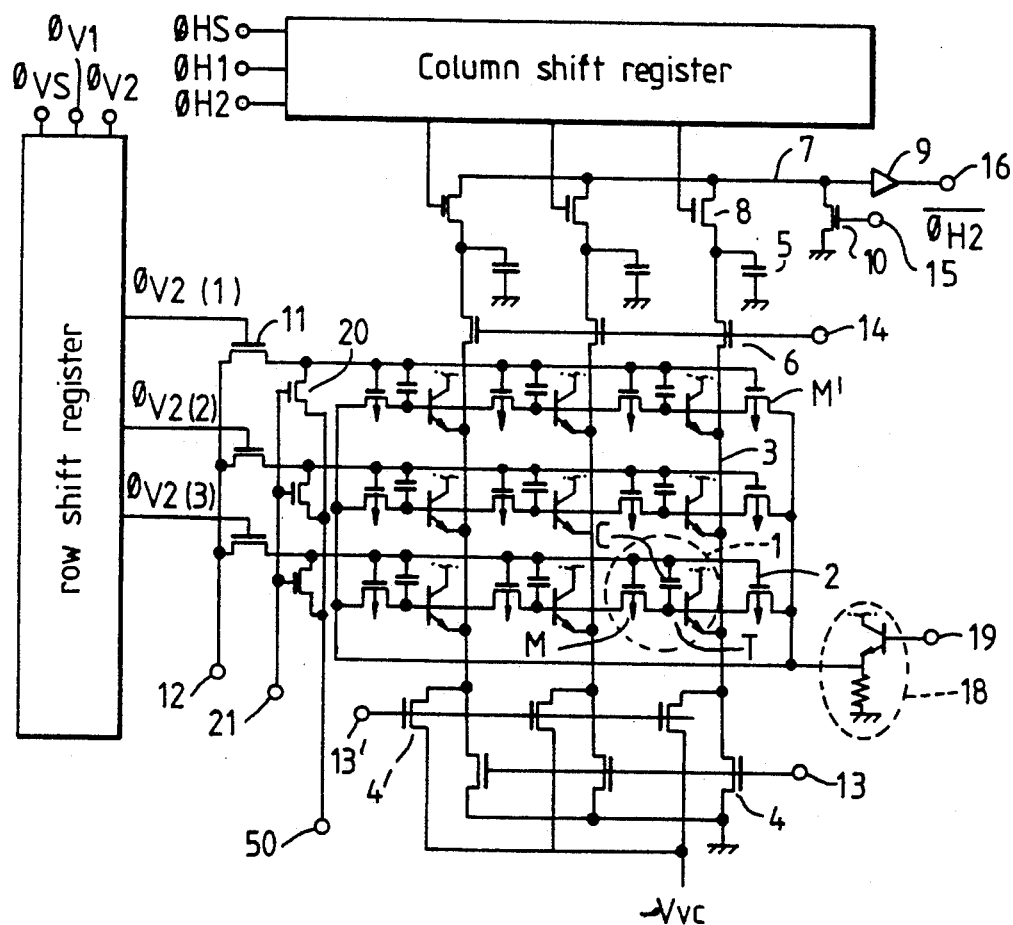
FIG. 11 shows a photoconversion device according to a further embodiment of the present invention.
Figure 12:
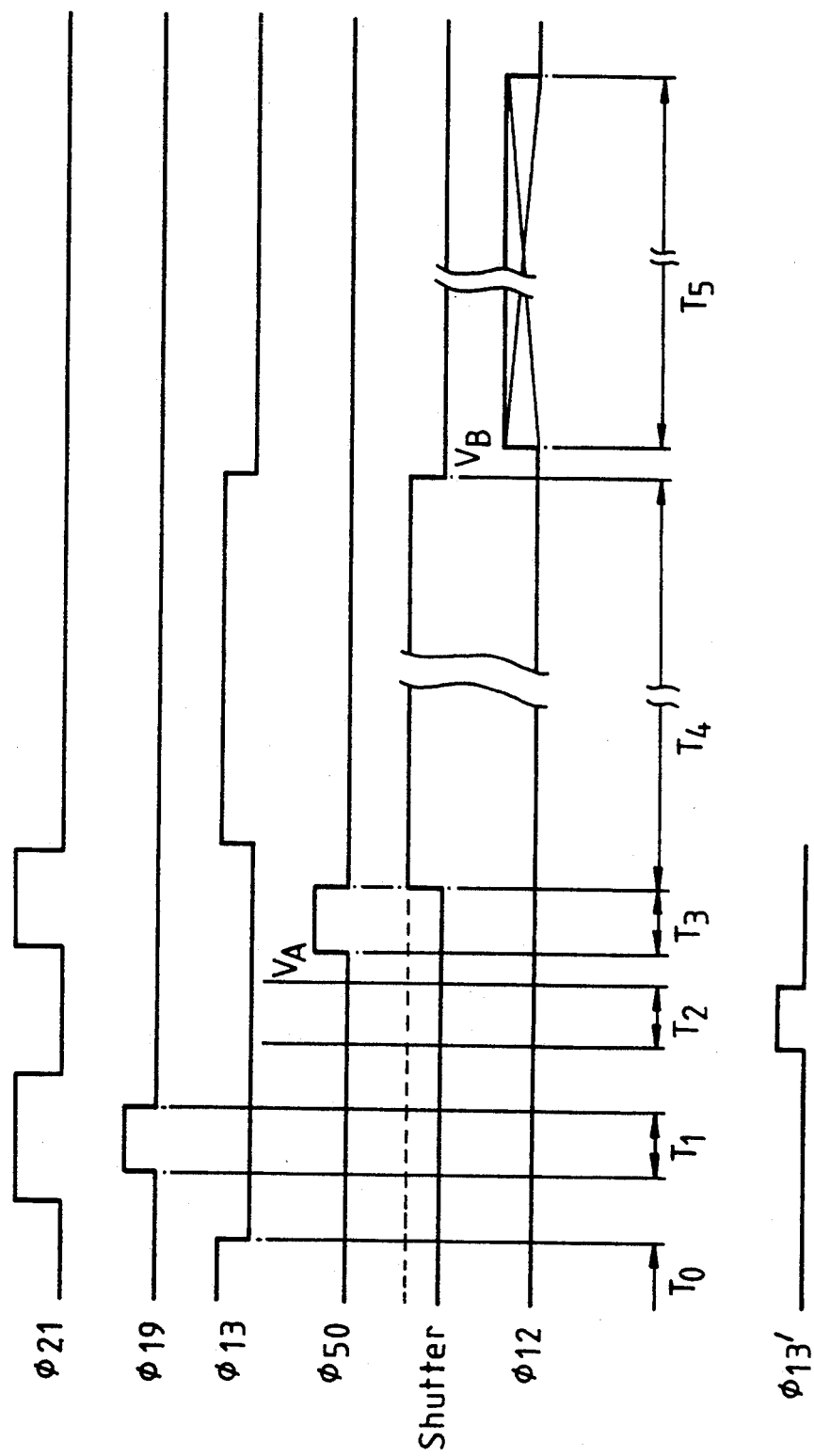
FIG. 12 illustrates a control waveform regime for the device of FIG. 11.

In FIG. 11 the device of FIG. 8 is further modified by adding FETs 4', controlled by control terminal 13', in parallel with FETs 4, so that the vertical output lines 3 may be connected to ground through the FETs 4 or alternatively to a negative voltage −Vvc through the FETs 4'. A first control regime for this device is shown in FIG. 12. This control regime is generally similar to the regime of FIG. 9 for the device of FIG. 8, except for the period T2.

In FIG. 12 during period T2 $\phi 13$ remains low, while $\phi 13'$ goes high, so that for the first simultaneous transient refresh operation the emitters of the sensors T are connected to the voltage −Vvc, which is below ground level. Therefore the emitters, and through them the bases, are pulled down strongly. In this way, the voltage on the base of each cell is reduced to be substantially ground level after the end of the first transient refresh operation in period T2, so that during the second transient refresh operation in period T3 a high instantaneous current is avoided even though the base is set to a voltage significantly above ground level during the complete refresh operation. Additionally, the emitter voltage is reliably brought to a low level before the second transient refresh operation is carried out, even if bright light is incident on the photoconversion element T so that the emitter was previously at a high level. Thus, the base-emitter junction can be reliably forward-biased during the second transient refresh operation in period T3.

In the arrangements of FIGS. 8 and 11 it is preferred that the voltage applied to the terminal 50 for a transient refresh operation, shown as VA in FIG. 12, is less than the voltage applied to the terminal 12 for read out, shown as VB in FIG. 12. Voltage VA sets the extent to which the base-emitter junction is reverse biased at the beginning of the exposure period, and by making voltage VB bigger than voltage VA the bipolar transistor type photoconversion element T can be relatively strongly forward biased during read out, so that a sufficient forward bias for an effective high speed read out operation can be achieved regardless of the $h_{fe}$ value of the photoconversion element T.

Figure 13:
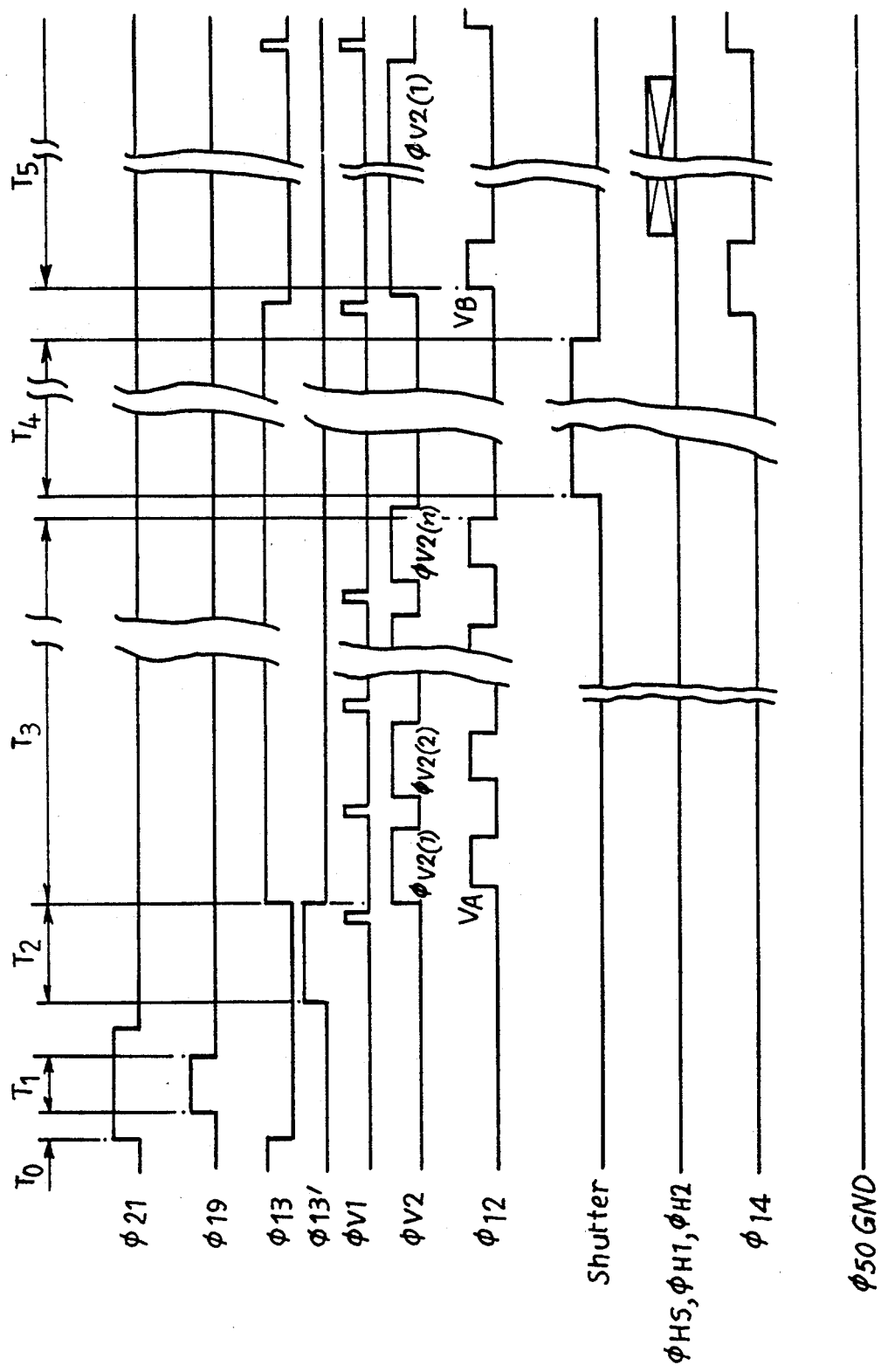
FIG. 13 illustrates an alternative control waveform regime for the device of FIG. 11.

FIG. 13 shows an alternative control regime for the device of FIG. 11. In this regime, the second transient refresh operation is carried out sequentially for the various lines of the array, rather than simultaneously, so that the currents flowing during the second transient refresh operation are lower. Accordingly, terminal 50 is maintained at ground level, and this terminal may be provided as a direct connection to ground in the manner of the device of FIG. 7.

In FIG. 13, the operations in periods T0, T1 and T2 are the same as in FIG. 12. However, for the second transient refresh operation $\phi 21$ and $\phi 50$ remain low, and instead the control voltage VA for the second transient refresh operation is provided in waveform $\phi 12$ while the row shift register provides row select signals $\phi v2$ to select each row of the array for transient refresh in turn. During the second transient refresh operation $\phi 13$ is high, connecting the emitters of the sensors T to ground through the vertical output line 3 and FETs 4.

Since the bases of the sensors are set to a relatively high voltage during the simultaneous complete refresh operation, a current will tend to flow from each sensor immediately its emitter is connected to ground. Thus, if the sequential transient refresh operation of period T3, in which a positive pulse is applied to the bases of the selected sensors T follows directly after the complete refresh operation, there will be a leak current from the non-selected sensor T in addition to a high current from the strongly forward biased selected sensors T. This is avoided by the preliminary simultaneous transient refresh operation during period T2. Even if the base voltage is above only 0.2 or 0.3 volts after the end of the simultaneous transient reset operation of period T2, a small leak current may flow from the emitters of non-selected sensors during the sequential transient reset operation in period T3. However, because the emitters are set to a lower voltage through the FETs 4, during the simultaneous transient reset operation than the emitter voltage set through the FETs 4 during the sequential transient refresh operation, the non-selected sensors are reliably turned off during the sequential transient refresh operation.

As previously mentioned, it is advantageous if the read out control voltage VB is higher than the transient refresh control voltage VA.

Since the final refresh operation is sequential in FIG. 13, the mechanical shutter 200 is kept closed during the refresh operation, and the exposure period T4 begins when the mechanical shutter opens.

As shown in FIG. 13, waveform $\phi 13$ is kept high during the exposure period T4, so that if one photoconversion sensor is exposed to very strong light and the cell is effectively saturated, the base-emitter junction will become forward biased and excess charges on the base will flow through the emitter to ground. This reduces problems, such as blooming, associated with strong light exposure of one photosensor element. However, following the ending of the exposure period T4 by closure of the mechanical shutter 200, the image signal is read out on the vertical output lines 3 and a residual portion of the current from a saturated photoconversion cell may be added to the signal on its associated vertical output line 3, so that blooming still occurs to some extent.

This residual blooming effect can be avoided if $\phi 13$ is low during the accumulation period T4 and $\phi 13$, is high. This means that the emitter voltage during the accumulation period is lower than the emitter voltage for the last transient refresh operation in which a positive base voltage is applied to the sensors. If the emitter voltage during the accumulation period is lower by a voltage VABV, the picture cells will saturate at a lower base voltage kVABV (where k is a coefficient for the change of base voltage with change of emitter voltage). By holding the emitter to this lower voltage during the accumulation period the maximum base voltage which can arise due to bright light is reduced. Following closure of the mechanical shutter 200, the emitter voltage can be returned to the voltage used during the sequential transient reset operation by turning off the FETs 4' and turning on the FETs 4. In this way, a saturation voltage margin is provided corresponding to kVABV, so that a saturated picture cell ceases to be saturated after the end of the exposure period, and therefore it does not influence the vertical output line 3 during the read out period. During the read out period T5 the mechanical shutter is kept closed so that incident light cannot affect the signal during this period, and particularly strong light cannot create blooming.

By keeping the output terminal of the picture cell (i.e. the emitter) at a standard voltage, in this case ground, for substantially the whole of the operation cycle except for the read out period and the simultaneous complete reset period, the reset current can be minimised.

Figure 14:
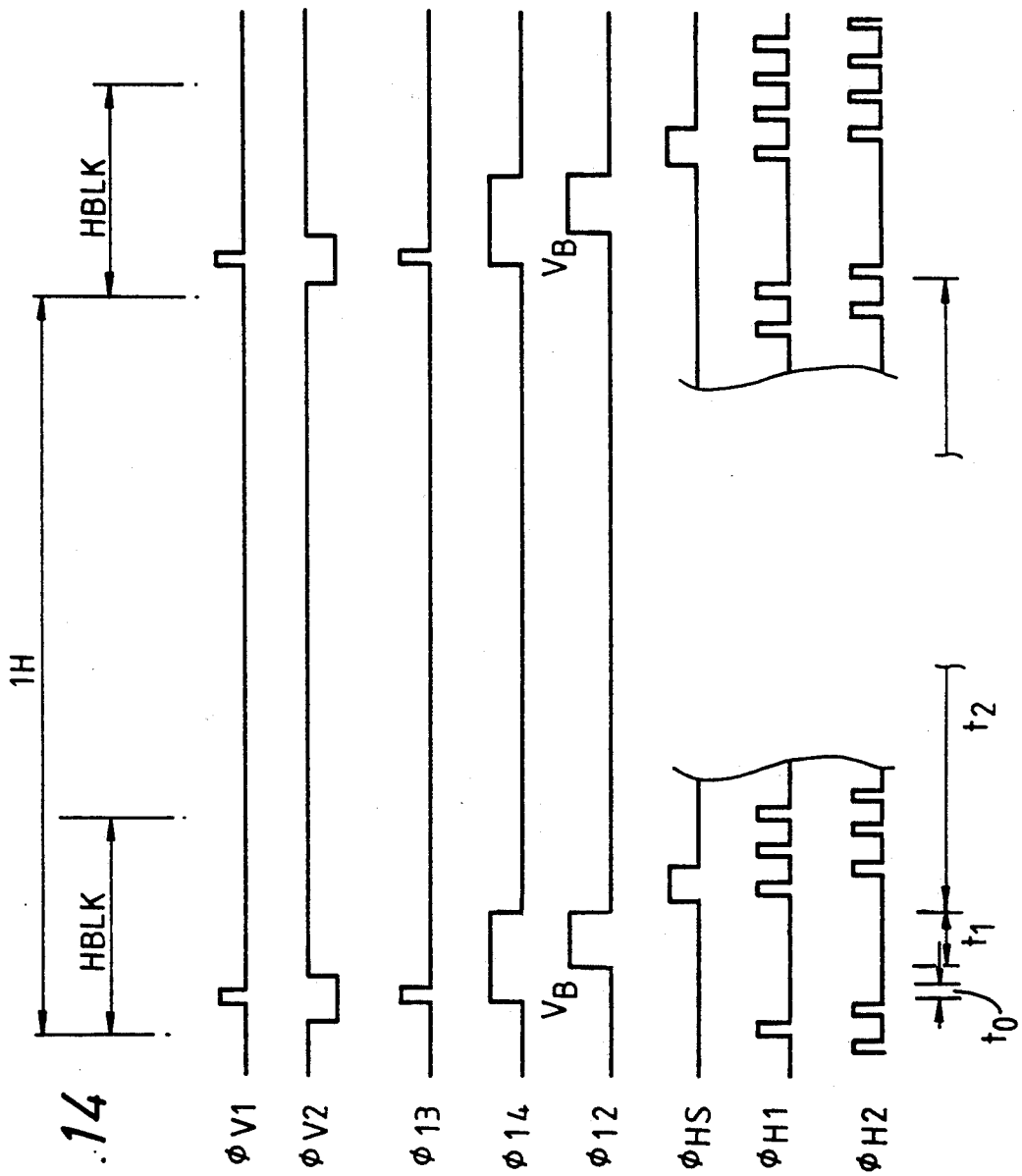
FIG. 14 illustrates a control waveform regime for the read out period for any of the illustrated photoconversion devices.

FIG. 11 also shows the control signal terminals for the row and column shift registers, and the waveforms for these signals are included in FIGS. 13 and 14. $\phi$VS is a vertical synchronising signal (i.e. a field synchronising signal) for resetting the operation of the row shift register. $\phi$V2 carries the waveforms which are output from the row shift register on the selected lines to turn the FETs 11 on and off. $\phi$V1 clocks the row shift register, so that each pulse of $\phi$V1 changes the output line of the row shift register which carries the waveform $\phi$V2. The operation of $\phi$V1 and $\phi$V2 can be seen clearly in FIG. 13, in which pulses of $\phi$V2 are output on successive output lines of the row shift register to enable successive rows of the array during the sequential transient refresh operation, and clocking pulses of $\phi$V1 change the selected row. The signals $\phi$HS, $\phi$H1 and $\phi$H2 provide equivalent functions for the column shift register, for the purpose of providing horizontal (row) synchronisation, read out timing and column selection signals within each row read out period.

FIG. 14 shows a control regime for the read out period T5. The read out period T5 is divided into horizontal line periods, marked 1H in FIG. 14. Each horizontal line period begins with a horizontal blanking period marked HBLK. At the beginning of the horizontal blanking period, in a period t0, $\phi$V2 goes low so that none of the horizontal drive lines 2 is enabled, and $\phi$V1 provides the clock pulse to select the next row of the array. Subsequently $\phi$V2 goes high again to turn on the FET 11 for the next row of the array. Also during the period t0, $\phi$14 is high to connect the storage capacitors 5 to the vertical output lines 3 through the FETs 6, and $\phi$13 goes on briefly during the period to connect the vertical output lines 3 to ground through the FETs 4. Thus, before the read out from the selected row begins, residual signals are removed from the storage capacitors 5 and the vertical output lines 3.

At the end of the period t0, $\phi$V1 and $\phi$13 go low again, but $\phi$14 remains high, and in a period t1 $\phi$V2 goes high to connect the selected horizontal drive line 2 to terminal 12, and $\phi$12 rises to the read out voltage VB. Accordingly, the base region of each sensor T of the selected row is raised through the capacitor C, and the output signal is provided to the respective vertical output line 3. Since $\phi$14 is high, the signal is passed to the respective storage capacitor 5. At the end of the period t1, $\phi$12 goes low ending the read out operation from the cells, and $\phi$14 goes low to isolate the storage capacitors 5 from vertical output lines 3. Then, in period t2 the operation of the column shift register is synchronised by $\phi$HS, and the signals stored in the storage capacitors 5 are read out in succession to the common horizontal output line 7, the amplifier 9 and the output terminal 16. This is done by turning on each FET 8 in succession, by the application of waveform $\phi$H2, with the FETs being selected in turn by the clocking action of $\phi$H1. In between the energisations of the FETs 8 to connect successive storage capacitors 5 to the common horizontal output line 7, the common horizontal output line 7 is grounded through FET 10 to remove any residual signal. This may be done by applying the inverse of $\phi$H2 to terminal 15, as shown in FIG. 11, or in any other convenient way such as by applying $\phi$H1 to terminal 15 or a specially generated control signal.

As previously mentioned, the read out voltage VB applied to the horizontal drive lines 2 is preferably greater than the transient refresh voltage VA, to ensure that a strong read out signal is provided from the sensors T.

In order to reduce the instantaneous current which flows when the sensors T are forward biased by a positive pulse on the base during transient refresh, the complete refresh voltage applied through emitter follower arrangement 18 may be made as low as possible, as an alternative to providing an operation in which the emitters of the sensors T are pulled down in what amounts to a preliminary transient refresh operation. However, there is a limit to the extent to which the emitter follower voltage can be lowered, since the voltage must be sufficiently high to ensure that the complete reset switch FETs M turn on. Accordingly, the use of the preliminary simultaneous transient reset operation during period T2 is preferred.

The present invention has been described with reference to embodiments given by way of example. Modifications and alternatives will be apparent to those skilled in the art.

What is claimed is:

1. A photoconversion device comprising:
   a photoconversion element comprising first and second main electrode regions and control region, charges being stored in the control region in response to incident light;
   a reset switch means for resetting the control region of the photosensitive element, the reset switch means having first and second main terminals and a control terminal; and
   means for turning on the reset switch means by varying a voltage applied to one of said main reset terminals while keeping a voltage at said control terminal substantially constant.

2. A device according to claim 1, in which the second main terminal of the reset switch means is coupled to the control region of the photoconversion element.

3. A device according to claim 1, in which the reset switch means comprises a field effect transistor.

4. A device according to claim 1, in which the control terminal of the refresh switch means is coupled to a control electrode for controlling the control region of the photoconversion element.

5. A device according to claim 4, in which the control electrode is capacitively coupled to the control region of the photoconversion element.

6. A device according to claim 1, in which the photoconversion element comprises a bipolar transistor, and the control region is a base region.

7. A device according to claim 6, in which the first main electrode region is an emitter region.

8. A control circuit for a photoconversion cell which cell has a photoconversion element which stores charges in a control region thereof in response to incident light and a reset switch means for resetting the control region, the control circuit comprising:

connection means connecting to a control terminal of the reset switch means and a main terminal of the reset switch means; and means for applying a turn-on voltage for the reset switch to the connection means connecting to said main terminal of the reset switch means to vary a voltage at the main electrode of the reset switch while keeping a voltage at the control terminal of the reset switch substantially constant.

9. A method of resetting a photoconversion element which stores charge in a control region thereof in response to incident light, comprising turning on a reset switch having first and second main terminals and a control terminal by applying a turn-on voltage to its first main terminal to cause a variation in a voltage of one of the main terminals of the reset switch while keeping a voltage at the control terminal of the reset switch substantially constant.

10. A photoconversion device comprising:
a plurality of rows of photoconversion elements, each of which comprises first and second main electrode regions and a control region, charges being stored in the control region in response to incident light;
first reset means for conducting a first reset operation at the same time for the photoconversion elements of more than one of the rows;
a plurality of reset switches, one coupled to each of said photoconversion elements and having at least one main electrode and a control electrode, each reset switch for resetting the corresponding photoconversion element by varying the voltage at said main electrode thereof while keeping the voltage at said control electrode thereof substantially constant.

11. A device according to claim 10, in which the plurality of rows form an X-Y addressable array of photoconversion elements.

12. A device according to claim 10, in which the first reset means sets the control region to a predetermined voltage level at least in the case that the control region voltage differs from the predetermined voltage in a first direction.

13. A device according to claim 10, in which the photoconversion element comprises a bipolar transistor, and the control region is a base region.

14. A device according to claim 13, in which the photoconversion element comprises a bipolar transistor, and the control region is a base region.

15. A device according to claim 10, in which the first reset means resets a photoconversion element by setting the control region setting to a predetermined voltage level.

16. A device according to claim 15, in which the first reset means sets the control region reset to a predetermined voltage level by altering the potential of the control region.

17. A device according to claim 15, in which the first reset means sets the control region reset to a predetermined voltage level by altering the potential of the first main terminal.

18. A device according to claim 10, which further comprises second reset means for conducting a second reset operation for the photoconversion element.

19. A device according to claim 18, in which the second reset means conducts a second reset operation at the same time for the photoconversion elements of more than one of the rows.

20. A device according to claim 18, in which the second reset means conducts a second reset operation at different times for photoconversion elements of different rows.

21. A device according to claim 18, in which the second reset means reset a photoconversion element by forward biasing the control region relative to the first main electrode region.

22. A device according to claim 21, in which the second reset means forward biases the control region relative to the first main electrode region by altering the potential of the control region.

23. A device according to claim 21, in which the second reset means forward biases the control region relative to the first main electrode region by altering the potential of the first main electrode region.

24. A control circuit for a photoconversion array having (i) a plurality of rows of photoconversion elements each of which stores charges in a control region thereof in response to incident light and (ii) a plurality of reset switches one coupled to each of said photoconversion elements and having at least one main electrode and a control electrode, the control circuit comprising circuitry to reset photoconversion elements of more than one of the rows at the same time, said reset circuitry varying the voltage at said main electrode of said reset switch while keeping the voltage at said control electrode of said reset switch substantially constant.

25. A method of operating a photoconversion device having (i) a plurality of rows of photoconversion elements each of which stores charge in a control region thereof in response to incident light and (ii) a plurality of reset switches each coupled to a corresponding photoconversion element and having a main electrode and a control electrode, the method comprising the step of resetting photoconversion elements of a plurality of rows at the same time using said reset switch, each reset switch being turned on to reset the corresponding photoconversion element by varying the voltage at said reset switch main electrode while keeping the voltage at said reset switch control electrode substantially constant.

26. A method according to claim 25, in which the photoconversion device comprises a shutter, and the method opening the shutter after said step of resetting for the photoconversion elements.

27. A photoconversion device comprising:
a photoconversion element which has first and second main electrode regions and a control region, charges being stored in the control region in response to incident light;
a reset switch coupled to said photoconversion element and having a main electrode and a control electrode; and
means for altering the potential of the first main electrode region to forward bias the control region relative to the first main electrode region, said means for altering turning-on said reset switch by varying the voltage at said reset switch main electrode while keeping the voltage at said reset switch control electrode substantially constant.

28. A device according to claim 27, which comprises a plurality of said photoconversion elements, and the said means alters the potential of the first main electrode regions of substantially all of the photoconversion elements at the same time.

29. A device according to claim 27, which further comprises reset means for altering the potential of the control region to forward bias it relative to the first main electrode region.

30. A device according to claim 27, in which the photoconversion element comprises a bipolar transistor, and the control region is a base region.

31. A device according to claim 30, in which the photoconversion element comprises a bipolar transistor, and the control region is a base region.

32. A control circuit for a photoconversion element which has (i) first and second main electrode regions and a control region in which charge is stored in response to incident light and (ii) a reset switch having a main electrode and a control electrode, the circuit comprising:
    connection means for connected to the photoconversion element; and
    means for altering the potential of the first main electrode region to forward bias the control region relative to the first main electrode region, said means for altering turning-on said reset switch by varying the voltage at said reset switch main electrode while keeping the voltage at said reset switch control electrode substantially constant.

33. A method of resetting a photoconversion element having (i) first and second main electrode regions and a control region on which charges are accumulated in response to incident light and (ii) a reset switch having a main electrode and a control electrode, in which a reset operation for the control region includes the step of altering the potential of the first main electrode region to forward bias the control region relative to the first main electrode region by turning on the reset switch by varying the voltage of the reset switch main electrode while keeping the voltage of the reset switch control electrode substantially constant.

34. A photoconversion device comprising:
    a photoconversion element including (i) first and second main electrode regions and a control region, charges being stored in the control region in response to incident light during an exposure period and (ii) a reset switch having a main electrode and a control electrode;
    means to read a photoconversion signal from the first main electrode during a read-out period; and
    means to hold the first main electrode at a first potential at a first time during the exposure period and change the first main electrode to a second potential by a second time between the exposure period and the read-out period, the second potential differing from the first potential in a direction tending to reverse-bias the control region relative to the first main region, said means to hold turning-on said reset switch by varying a voltage at said reset switch main electrode while keeping a voltage at said reset switch control electrode substantially constant.

35. A device according to claim 34, in which the photoconversion element comprises a bipolar transistor, and the control region is a base region.

36. A device according to claim 35, in which the photoconversion element comprises a bipolar transistor, and the control region is a base region.

37. A method of operating a photoconversion element having (i) first and second main electrode regions and a control region and (ii) a reset switch having a main electrode and a control electrode, comprising the steps of:
    holding the first main electrode region at a first voltage at a first time during an exposure period in which charges are stored in the control region in response to incident light;
    reading a photoconversion signal from the first main electrode during a read-out period;
    bringing the first main region to a second voltage by a second time between the exposure period and the read-out period, the second voltage differing from the first voltage in the direction tending to reverse bias the control region relative to the first main electrode region; and
    turning on said reset switch by varying the voltage at the reset switch main electrode while keeping the voltage at said reset switch control electrode substantially constant.

38. A method according to claim 37, which comprises resetting the photoconversion element before the exposure period by an operation including the step of forward biasing the control region relative to the first main region while holding the first main region at the second voltage.

* * * * *

UNITED STATES PATENT AND TRADEMARK OFFICE
CERTIFICATE OF CORRECTION

PATENT NO. : 5,288,988
DATED : February 22, 1994
INVENTOR(S) : SEIJI HASHIMOTO ET AL.          Page 1 of 3

It is certified that error appears in the above-identified patent and that said Letters Patent is hereby corrected as shown below:

AT [57] ABSTRACT

Line 1, "comprises" should read --comprises a--.

COLUMN 2

Line 6, "Thus" should read --Thus,--.

COLUMN 5

Line 2, "example" should read --example,--.

COLUMN 8

Line 17, "go - negative" should read --go negative--.

COLUMN 10

Line 10, "period T2 $\phi$13" should read --period T2, $\phi$13--.
    Line 49, "period T1" should read --period T1,--.
    Line 50, "period T3 $\phi$13" should read --period T3, $\phi$3--.

COLUMN 11

Line 13, "FIG. 11" should read --FIG. 11,--.
    Line 22, "FIG. 12" should read --FIG. 12,-- and "period T2 $\phi$13" should read --period T2, $\phi$13--.
    Line 42, "and 11" should read --and 11,--.
    Line 66, "operation" should read --operation,--.

UNITED STATES PATENT AND TRADEMARK OFFICE
CERTIFICATE OF CORRECTION

PATENT NO. : 5,288,988
DATED : February 22, 1994
INVENTOR(S) : SEIJI HASHIMOTO ET AL.      Page 2 of 3

It is certified that error appears in the above-identified patent and that said Letters Patent is hereby corrected as shown below:

COLUMN 12

Line 3, "operation" should read --operation,--.
Line 23, "FETs 4," should read --FETs 4',--.
Line 52, "φ13," should read --φ13'--.
Line 62, "period" should read --period,--.

COLUMN 13

Line 41, "Subsequently" should read --Subsequently,--.

COLUMN 15

Line 5, "to said" should read --to the said--.
Line 64, "element." should read --elements.--.

COLUMN 16

Line 6, "reset" (second occurrence) should read --resets--.

UNITED STATES PATENT AND TRADEMARK OFFICE
CERTIFICATE OF CORRECTION

PATENT NO. : 5,288,988
DATED : February 22, 1994
INVENTOR(S) : SEIJI HASHIMOTO ET AL.

It is certified that error appears in the above-identified patent and that said Letters Patent is hereby corrected as shown below:

Column 17, line 16, "connected" should read --connection--.

Signed and Sealed this

Eighth Day of November, 1994

Attest:

BRUCE LEHMAN

Attesting Officer

Commissioner of Patents and Trademarks